US010714447B2

(12) United States Patent
Yoneyama et al.

(10) Patent No.: US 10,714,447 B2
(45) Date of Patent: Jul. 14, 2020

(54) ELECTRODE TERMINAL, SEMICONDUCTOR DEVICE, AND POWER CONVERSION APPARATUS

(71) Applicant: Mitsubishi Electric Corporation, Tokyo (JP)

(72) Inventors: Rei Yoneyama, Tokyo (JP); Yoshitaka Kimura, Tokyo (JP); Akihiko Yamashita, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/286,771

(22) Filed: Oct. 6, 2016

(65) Prior Publication Data

US 2017/0221853 A1    Aug. 3, 2017

(30) Foreign Application Priority Data

Feb. 3, 2016  (JP) .................................. 2016-018513

(51) Int. Cl.
*H01L 23/053* (2006.01)
*H01L 23/055* (2006.01)
(Continued)

(52) U.S. Cl.
CPC .............. *H01L 24/37* (2013.01); *H01L 23/04* (2013.01); *H01L 23/053* (2013.01);
(Continued)

(58) Field of Classification Search
CPC ....... H01L 24/37; H01L 24/40; H01L 23/055; H01L 2224/77343; H01L 2224/4005;
(Continued)

(56) References Cited

U.S. PATENT DOCUMENTS 5,510,650 A * 4/1996 Erskine, Jr. ......... H01L 23/3672
257/707
7,839,003 B2 * 11/2010 Hamada ............ H01L 23/49524
257/666
(Continued)

FOREIGN PATENT DOCUMENTS

CN    102969306 A    3/2013
CN    103201834 A    7/2013
(Continued)

OTHER PUBLICATIONS

An Office Action mailed by the State Intellectual Property Office of the People's Republic of China dated Oct. 9, 2018, which corresponds to Chinese Patent Application No. 201710063383.0 and is related to U.S. Appl. No. 15/286,771; with English translation.
(Continued)

*Primary Examiner* — Zandra V Smith
*Assistant Examiner* — Abbigale A Boyle
(74) *Attorney, Agent, or Firm* — Studebaker & Brackett PC

(57) ABSTRACT

An electrode terminal includes a body and a first bonding part. The body includes a first metal material. Then, the first bonding part is bonded to one end of the body, and includes a second metal material which is a clad material other than the first metal material. The first bonding part is ultrasonically bondable to a first bonded member. An elastic part which is elastically deformable is provided between the one end of the body and the other end of the body.

14 Claims, 11 Drawing Sheets

(51) Int. Cl.
  *H01L 23/00* (2006.01)
  *H01L 23/04* (2006.01)
  *H01L 25/07* (2006.01)
(52) U.S. Cl.
  CPC ............ *H01L 23/055* (2013.01); *H01L 24/35* (2013.01); *H01L 24/40* (2013.01); *H01L 24/744* (2013.01); *H01L 24/81* (2013.01); *H01L 24/84* (2013.01); *H01L 24/05* (2013.01); *H01L 24/32* (2013.01); *H01L 24/48* (2013.01); *H01L 24/73* (2013.01); *H01L 25/072* (2013.01); *H01L 2224/04034* (2013.01); *H01L 2224/05644* (2013.01); *H01L 2224/05647* (2013.01); *H01L 2224/29101* (2013.01); *H01L 2224/32225* (2013.01); *H01L 2224/33181* (2013.01); *H01L 2224/352* (2013.01); *H01L 2224/37011* (2013.01); *H01L 2224/37012* (2013.01); *H01L 2224/3756* (2013.01); *H01L 2224/37147* (2013.01); *H01L 2224/37624* (2013.01); *H01L 2224/48091* (2013.01); *H01L 2224/48247* (2013.01); *H01L 2224/73263* (2013.01); *H01L 2224/8122* (2013.01); *H01L 2224/81385* (2013.01); *H01L 2224/83801* (2013.01); *H01L 2224/848* (2013.01); *H01L 2224/84205* (2013.01); *H01L 2224/84801* (2013.01); *H01L 2924/00014* (2013.01); *H01L 2924/1033* (2013.01); *H01L 2924/10253* (2013.01); *H01L 2924/10272* (2013.01); *H01L 2924/13055* (2013.01); *H01L 2924/13091* (2013.01)
(58) Field of Classification Search
  CPC ..... H01L 2224/4007; H01L 2224/4009; H01L 2224/40091; H01L 2224/40095; H01L 2224/37012
  See application file for complete search history.

(56) References Cited

U.S. PATENT DOCUMENTS

| | | | | | |
|---|---|---|---|---|---|
| 8,253,224 | B2* | 8/2012 | Hu | .................... | H01L 23/49524 257/673 |
| 8,378,468 | B2* | 2/2013 | Fujioka | ............. | H01L 23/49524 257/666 |
| 8,796,563 | B2* | 8/2014 | Ikeda | ................ | H01L 23/49811 174/255 |
| 9,406,592 | B2* | 8/2016 | Kohl | ....................... | H01L 24/33 |
| 2008/0246130 | A1* | 10/2008 | Carney | ............... | H01L 23/4334 257/675 |
| 2009/0065910 | A1 | 3/2009 | Hamada et al. | | |
| 2010/0206632 | A1 | 8/2010 | Ikeda et al. | | |
| 2011/0241198 | A1* | 10/2011 | Azuma | ............... | H01L 23/4334 257/696 |
| 2013/0009295 | A1* | 1/2013 | Otremba | ................. | H01L 24/34 257/676 |
| 2013/0049201 | A1 | 2/2013 | Yoshida et al. | | |
| 2013/0201741 | A1* | 8/2013 | Tompkins | ............. | H02M 7/003 363/131 |
| 2014/0054757 | A1* | 2/2014 | Ikuta | ........................ | C25D 7/00 257/666 |
| 2015/0061098 | A1* | 3/2015 | Imoto | .................... | H01L 23/24 257/676 |
| 2016/0111367 | A1* | 4/2016 | Park | ..................... | H01L 21/565 257/773 |

FOREIGN PATENT DOCUMENTS

| | | |
|---|---|---|
| CN | 104425471 A | 3/2015 |
| JP | H04360556 A | 12/1992 |
| JP | 2005129442 A | 5/2005 |
| JP | 2008-117825 A | 5/2008 |
| JP | 2009004435 A | 1/2009 |
| JP | 2009-038139 A | 2/2009 |
| JP | 2009-200088 A | 9/2009 |
| JP | 2013-051366 A | 3/2013 |
| JP | 2013-235882 A | 11/2013 |
| JP | 2014-056917 A | 3/2014 |
| JP | 2015-056412 A | 3/2015 |
| JP | 2015046416 A | 3/2015 |

OTHER PUBLICATIONS

An Office Action mailed by the Japanese Patent Office dated Jan. 22, 2019, which corresponds to Japanese Patent Application No. 2016-018513 and is related to U.S. Appl. No. 15/286,771.

An Office Action; "Notification of Reasons for Refusal," Mailed by the Japanese Patent Office dated Jul. 16, 2019, which corresponds to Japanese Patent Application No. 2016-018513 and is related to U.S. Appl. No. 15/286,771; with English language translation.

An Office Action mailed by the State Intellectual Property Office dated May 17, 2019, which corresponds to Chinese Patent Application No. 201710063383.0 and is related to U.S. Appl. No. 15/286,771.

An Office Action mailed by the State Intellectual Property Office of the People's Republic of China dated Oct. 23, 2019, which corresponds to Chinese Patent Application No. CN201710063383.0.

An Office Action; "Notification of Reasons for Refusal," mailed by the Japanese Patent Office dated Jan. 7, 2020, which corresponds to Japanese Patent Application No. 2016-018513 and is related to U.S. Appl. No. 15/286,771; with English language translation.

* cited by examiner

ELECTRODE TERMINAL, SEMICONDUCTOR DEVICE, AND POWER CONVERSION APPARATUS

BACKGROUND OF THE INVENTION

Field of the Invention

The present invention relates to an electrode terminal which is ultrasonically bondable to a bonded member, a semiconductor device including the foregoing electrode terminal, and a power conversion apparatus including the foregoing electrode terminal.

Description of the Background Art

A semiconductor module (semiconductor device) used for power control, which is equipped with a power semiconductor element within a package, is called a power module. As a power semiconductor element, for example, a switching device such as an insulated gate bipolar transistor (IGBT) and a metal oxide semiconductor field effect transistor (MOSFET), a freewheel diode (FWDi), or the like is employed. In such a power module as described above, conventionally, for leading out of an electrode from a power semiconductor chip, a bonding method such as wire bonding and direct lead bonding is used.

In wire bonding, it is general that a wire having a diameter in a range of several tens to several hundreds μm is bonded, and a plurality of wires are bonded in order to ensure an allowable amount of a current required for energization.

However, because of a constraint to a physical dimension of a bonding apparatus, there is a limit to bonding of a plurality of wires at a high density, so that the desired number of wires cannot be bonded in some instances. As a result of this, a density of a current flowing in each wire is increased, which then increases heat generation in a wire during energization. This causes a problem of reduction in a life of bonding between a power semiconductor chip and a bonding surface, and another problem of a need to enhance heat resistance of members provided around a wire. Also, an impedance component in wiring increases as the number of wires is reduced, so that desired electrical characteristics cannot be attained in some instances. For example, in a case where impedance of electrode wiring is large, a surge voltage which is caused at a time of a high-speed switching operation of a power semiconductor element is increased, so that usable regions of a voltage and a current in a power semiconductor element are significantly limited in some instances.

As a bonding method which is different from wire bonding described above, there is cited direct lead bonding in which an electrode terminal is soldered directly onto a power semiconductor chip (Japanese Patent Application Laid-Open No. 2009-200088, for example). According to this bonding method, an electrode which has a larger cross-sectional area and a larger bonding area than a wire for wire bonding is bonded, so that effects of reduction in heat generation resulted from reduction in current density, an improved life of a bonding part, ensuring of a margin of heat resistance of a member provided around an electrode and a chip, and reduction in impedance can be attained.

However, in order to achieve solder bonding in direct lead bonding described above, it is necessary to change a surface of a chip to a metal material such as "gold" which is suitable for soldering. To make such a change, it is conceived to form a bonding layer including "gold" on a bonding surface of a power semiconductor chip. However, formation of a bonding layer creates a need for an additional process such as sputtering, to cause a problem of complicating manufacturing processes.

SUMMARY OF THE INVENTION

The present invention has been made in view of the above-described problems, and it is an object of the present invention to provide a technique which allows for increased reliability and a longer life of a device.

The present invention is directed to an electrode terminal, and the electrode terminal includes a body including a first metal material, and a first bonding part which is connected to one end of the body and includes a second metal material which is a clad material other than the first metal material. The first bonding part is ultrasonically bondable to a first bonded member, and an elastic part which is elastically deformable is provided between one end of the body and the other end of the body.

It is possible to increase reliability and lengthen a life of a device.

These and other objects, features, aspects and advantages of the present invention will become more apparent from the following detailed description of the present invention when taken in conjunction with the accompanying drawings.

DESCRIPTION OF THE PREFERRED EMBODIMENTS

The following description will be made, assuming that a semiconductor device according to the present invention is a power module. Also, the drawings provide schematic illustrations, and correlations among structural elements with respect to sizes and positions, which are shown in different drawings, are not necessarily exact, and can be changed as appropriate.

Relevant Power Module

Figure 1:
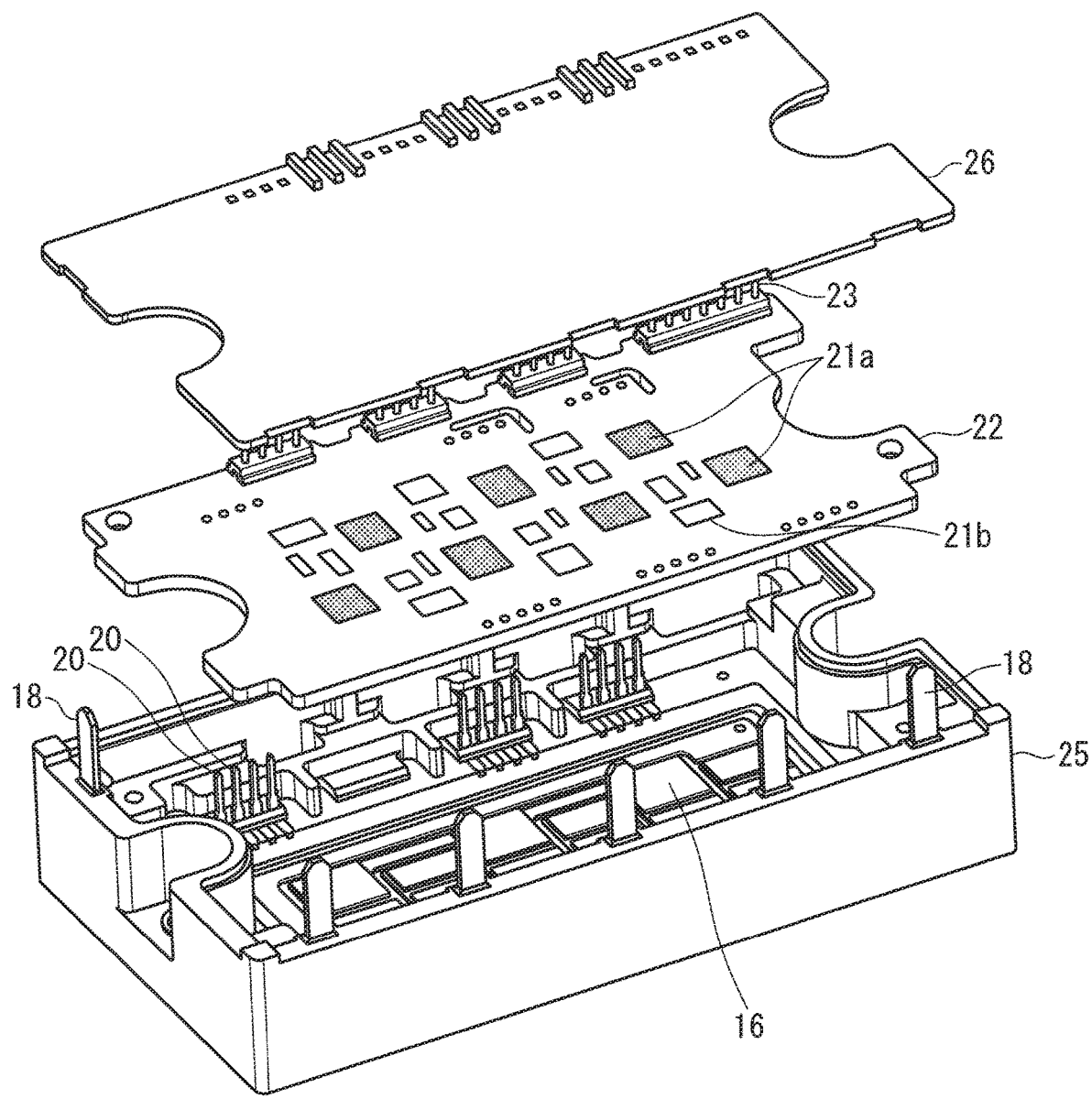
FIG. 1 is an exploded perspective view showing a structure of a relevant power module.
Figure 2:
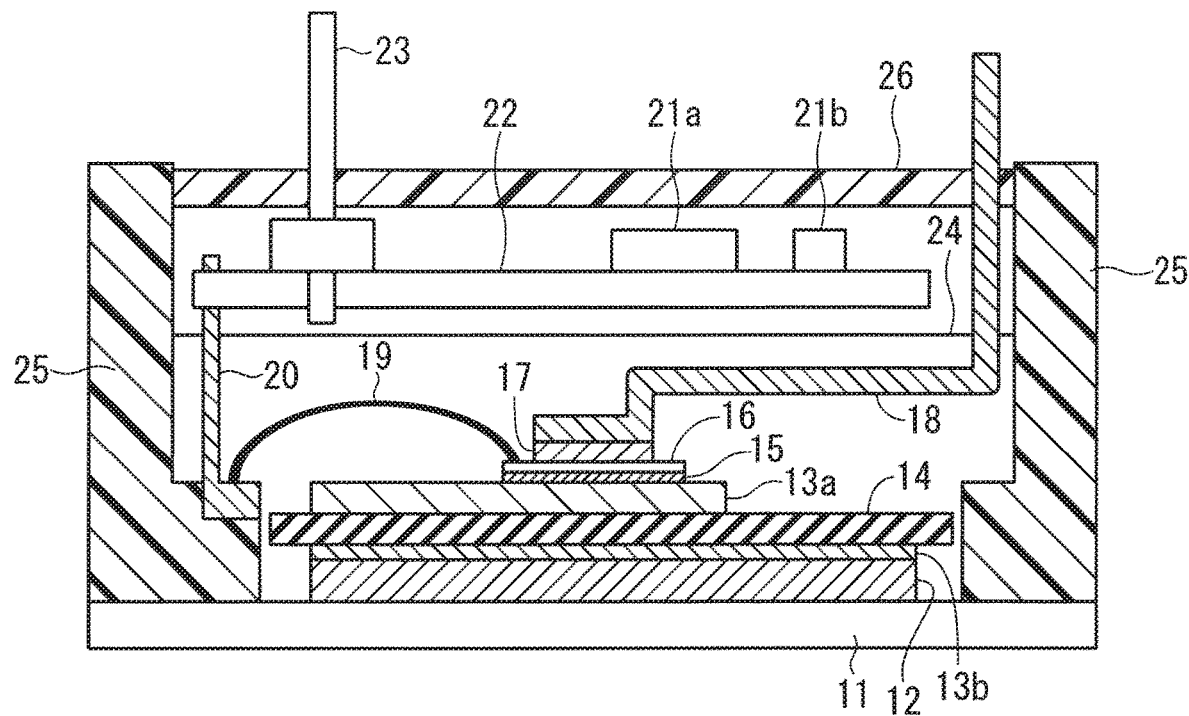
FIG. 2 is a cross-sectional view showing the structure of the relevant power module.

First, before describing a power module according to preferred embodiments of the present invention, a power module which is relevant to the power module according to the preferred embodiments of the present invention (which will be hereinafter referred to as a "relevant power module"), will be described. FIG. 1 is an exploded perspective view showing a structure of the relevant power module, and FIG. 2 is a cross-sectional view showing the structure of the relevant power module.

The relevant power module includes a base 11; an insulating substrate (insulating layer) 14 which is disposed on the base 11 with solder 12 and a circuit pattern 13b being interposed therebetween; a power semiconductor chip (semiconductor chip) 16 which is disposed on the insulating substrate 14 with a circuit pattern 13a and solder 15 being interposed therebetween; a main electrode terminal 18 which is bonded to the power semiconductor chip 16 by solder 17; and a control signal terminal 20 which is connected to the power semiconductor chip 16 through a wire 19 and is used for internal relay.

Further, the relevant power module includes a control board (printed circuit board) 22 which is connected to the control signal terminal 20 and is provided with a control integrated circuit (IC) 21a and a control circuit part 21b; a control signal terminal 23 which is connected to the control board 22, is partly exposed to an outside, and is used for external input/output; and a sealing resin 24 which seals mostly structural elements of the relevant power module.

Moreover, the relevant power module includes a case 25 and a lid 26 which accommodate the sealing resin 24 and the like, and form a package which employs the base 11 as a bottom thereof.

Figure 3:
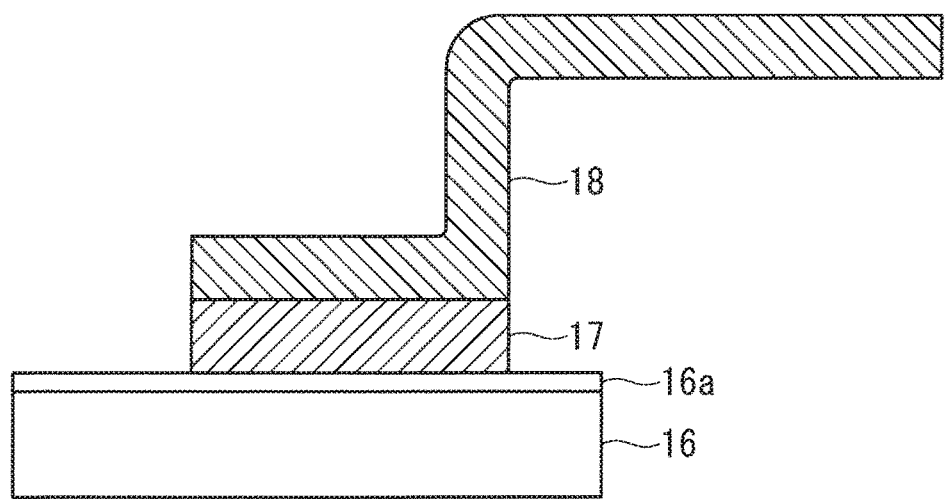
FIG. 3 is a cross-sectional view showing a structure of a part of the relevant power module.

FIG. 3 is an enlarged cross-sectional view of the power semiconductor chip 16, the solder 17, and the main electrode terminal 18 of the relevant power module. The main electrode terminal 18 is formed by bending a plate member including one metal material.

On an upper surface of the power semiconductor chip 16, a bonding layer 16a including a solder-bondable metal material (for example, copper, gold, and the like) is formed (disposed) by sputtering or the like, and the main electrode terminal 18 is bonded to the bonding layer 16a by the solder 17.

In the above-described relevant power module, the main electrode terminal 18 having a cross-sectional area and a bonding area which are relatively large is electrically connected to the power semiconductor chip 16. Thus, it is possible to attain effects of reduction in heat generation resulted from reduction in current density, an improved life of a bonding part, ensuring of a margin for heat resistance of a member provided around an electrode and a chip, and reduction in impedance.

Nonetheless, strength of bonding between the solder 17 and the power semiconductor chip 16 is relatively weak, which necessitates disposition of the bonding layer 16a suitable for soldering, to cause a problem of complicating processes. In contrast thereto, power modules according to first to eighth preferred embodiments and modifications of the present invention, which will be described below, can solve such the problem as described above.

First Preferred Embodiment

Figure 4:
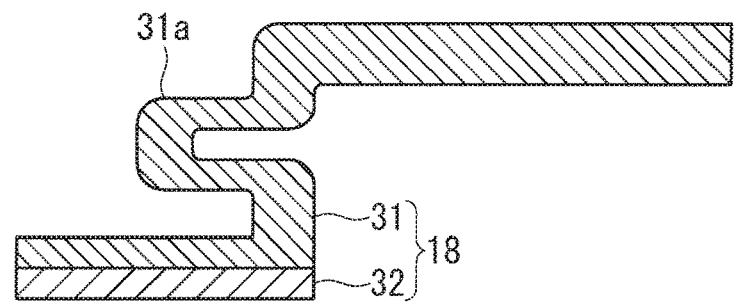
FIG. 4 is a cross-sectional view showing a structure of a part of a power module according to a first preferred embodiment.

FIG. 4 is a cross-sectional view showing a structure of a part of a power module according to the first preferred embodiment. It is noted that, out of structural elements described in the first preferred embodiment, structural elements which are the same as, or analogous to, the structural elements of the relevant power module, will be denoted by the same reference symbols, and structural elements which are different from the structural elements of the relevant power module will be chiefly discussed. Also, though an electrode terminal according to the present invention is applied as the main electrode terminal 18 in the first preferred embodiment, the application is not limited to that. The electrode terminal according to the present invention can be applied as another electrode terminal as described later.

The main electrode terminal 18 in FIG. 4 has a body 31 and a first bonding part 32, and includes a plurality of materials (a first metal material and a second metal material).

The body 31 is formed by bending a plate member including the first metal material (for example, a metal material such as copper). According to the first preferred embodiment, a bent part for producing a spring effect (bending effect) is provided as an elastic part 31a which is elastically deformable, between one end of the body 31 and the other end of the body 31.

The first bonding part 32 includes the second metal material (for example, a metal material such as aluminum) which is a clad material other than the first metal material, and is bonded to one end of the body 31. In the following description, out of opposite ends of the body 31, an end of the body 31 to which the first bonding part 32 is bonded will be referred to as "the one end", and an end of the body 31 to which the first bonding part 32 is not bonded will be referred to as "the other end".

Figure 5:
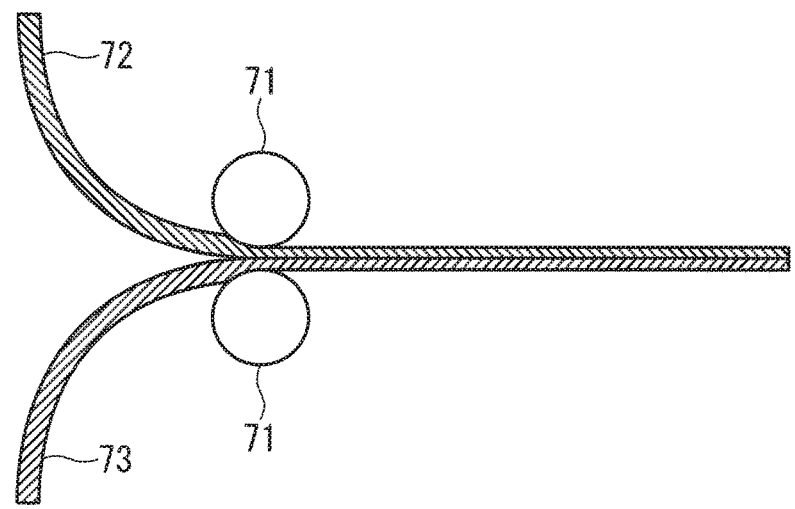
FIG. 5 is a view for explaining a clad material.

As shown in FIG. 5, a clad material is one metal material 73 which is bonded to another metal material 72 by being rolled by a roller 71 or the like. Thus, the first bonding part 32 in FIG. 4 which is a clad material is bonded to the body 31 by being rolled. Then, the first bonding part 32 bonded to the body 31 is ultrasonically bondable to a first bonded member.

Figure 6:
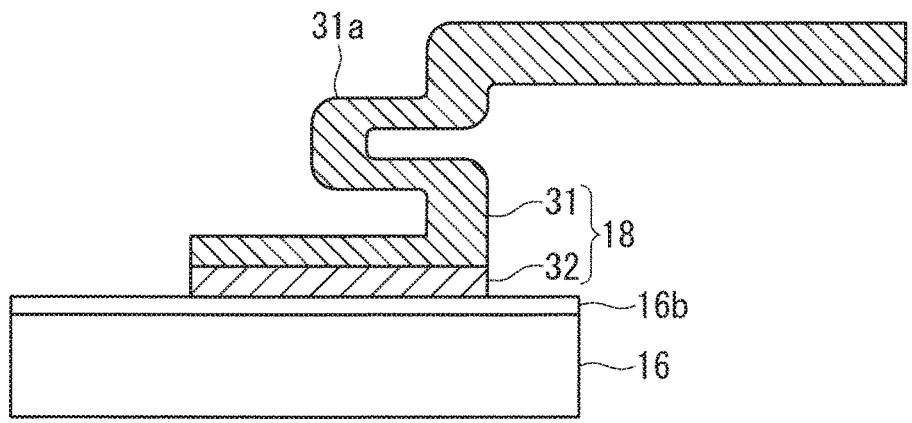
FIGS. 6 and 7 are cross-sectional views each showing a structure of a part of the power module according to the first preferred embodiment.

FIG. 6 is a cross-sectional view showing how the main electrode terminal 18 of the power module according to the first preferred embodiment is bonded. The power semiconductor chip 16 which is the first bonded member is ultrasonically bonded to the first bonding part 32.

According to the first preferred embodiment configured in the above-described manner, as with the main electrode terminal 18 of the relevant power module (FIG. 3), the main electrode terminal 18 has a cross-sectional area and a bonding area which are relatively large. Accordingly, as with the main electrode terminal 18 of the relevant power module, the main electrode terminal 18 according to the first preferred embodiment can attain effects of reduction in heat generation resulted from reduction in a current density, an improved life of a bonding part, ensuring of a margin for heat resistance of a member provided around an electrode and a chip, and reduction in impedance.

Further, according to the first preferred embodiment, the first boding part 32 which is ultrasonically bondable is included, so that strength of bonding between the power semiconductor chip 16 and the main electrode terminal 18 can be made higher than that in the relevant power module, which results in increased reliability and a longer life. Moreover, in an analogous manner to an example shown in FIG. 3 in which the main electrode terminal 18 of the relevant power module is bonded to the power semiconductor chip 16 via the bonding layer 16*a*, in an example shown in FIG. 6, the main electrode terminal 18 is bonded to the power semiconductor chip 16 via a bonding layer 16*b* which includes an ultrasonically bondable metal material (for example, aluminum, gold, silver, copper, or the like). However, according to the first preferred embodiment, even if the bonding layer 16*b* is not provided, strength of bonding between the power semiconductor chip 16 and the main electrode terminal 18 can be made higher than that in the relevant power module. That is, the bonding layer 16*b* is not indispensable in the first preferred embodiment, so that simplification of processes and improvements in productivity can be expected.

Meanwhile, as shown in FIG. 1, the other ends of the main electrode terminals 18 are fixed to a package, and the portions of the other ends of the main electrode terminals 18 are fixed as external electrode terminals. Thus, when thermal deformation or vibration occurs in a power module itself, stress or distortion is transferred to the one end of the main electrode terminal 18 (body 31). As a result of this, fatigue is caused in bonding between the power semiconductor chip 16 and the main electrode terminal 18 (the first bonding part 32), to probably shorten a life of the bonding. Also, for example, if vibration of an ultrasonic wave which is caused when ultrasonically bonding to the power semiconductor chip 16 is transferred to the other end of the main electrode terminal 18 (body 31), fixing of the other end to a package is probably degraded.

With regard to this, according to the first preferred embodiment, the elastic part 31*a* is provided between the one end and the other end of the body 31 (in the vicinity of the one end of the body 31 in FIGS. 4 and 6). Thus, it is possible to reduce influences of vertical and horizontal movements of one of the one end and the other end of the body 31 upon the other. In other words, deformation or vibration of one of the one end and the other end of the body 31 cannot be easily followed by the other. Therefore, it is possible to lengthen a life of bonding between the power semiconductor chip 16 and the main electrode terminal 18, and a life of fixing of the other end of the body 31 to a package.

Figure 7:
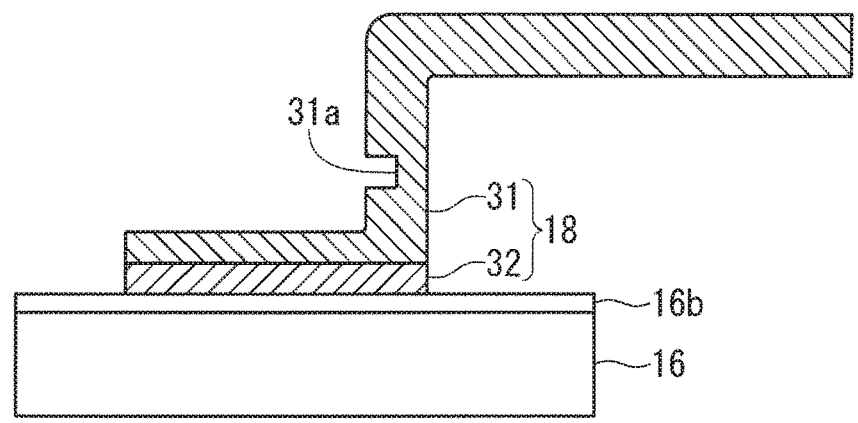

It is additionally noted that it has been described above that a bent part for producing a spring effect (bending effect) is provided as the elastic part 31*a* which is elastically deformable, between the one end and the other end of the body 31. However, the elastic part 31*a* is not limited to such a configuration. As shown in FIG. 7, a notched part may be provided as the elastic part 31*a* which is elastically deformable, between the one end the other end of the body 31 (in the vicinity of the one end of the body 31 in FIG. 7). Also, though it has been described above that the first bonded member which is ultrasonically bonded to the first bonding part 32 is the power semiconductor chip 16, the first bonded member is not limited to the power semiconductor chip 16, and may be a circuit pattern or the like as described later, for example.

Second Preferred Embodiment

Figure 8:
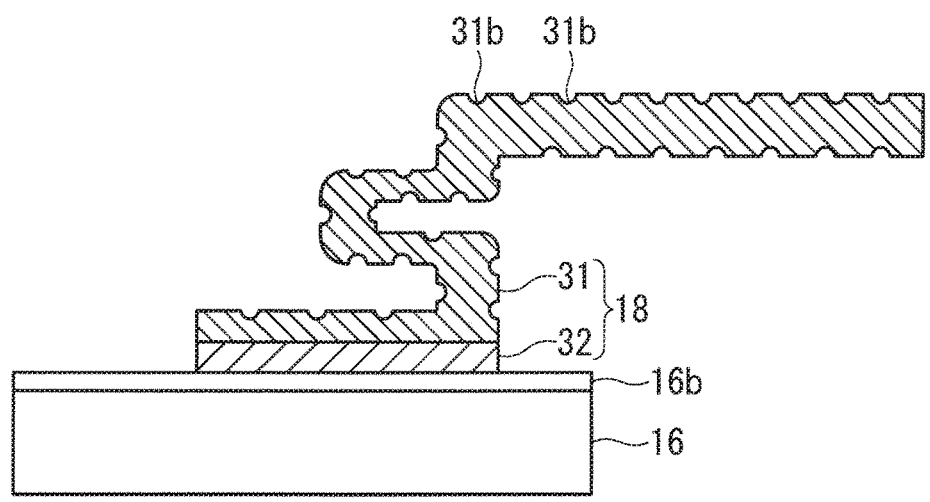
FIG. 8 is a cross-sectional view showing a structure of a part of a power module according to a second preferred embodiment.

FIG. 8 is a cross-sectional view showing a part of a structure of a power module according to the second preferred embodiment. It is noted that, out of structural elements described in the second preferred embodiment, structural elements which are the same as, or analogous to, the structural elements described in the first preferred embodiment, will be denoted by the same reference symbols, and structural elements which are different from the structural elements in the first preferred embodiment will be chiefly discussed.

According to the second preferred embodiment, one or more irregularities 31*b* are provided in a part or all parts of a surface of the body 31. For example, in an example shown in FIG. 8, a plurality of irregularities (recesses) 31*b* are provided in almost all parts of a surface of the body 31. Additionally, in place of the one or more irregularities 31*b*, one or more holes may be provided in a part or all parts of a surface of the body 31 though such holes are not shown in the drawings. Then, the irregularities 31*b* and holes can be formed by using a mechanical treatment such as punching or laser processing, or can be formed by using a chemical treatment such as surface roughening processing.

It should be noted that generally, a current in a high-frequency switching operation flows through a surface of the main electrode terminal 18 because of a skin effect. According to the second preferred embodiment, by provision of the above-described irregularities 31*b* or holes in a surface of the body 31, a surface area of the main electrode terminal 18 can be increased. Accordingly, it is possible to reduce impedance in a high-frequency switching operation.

Third Preferred Embodiment

Figure 9:
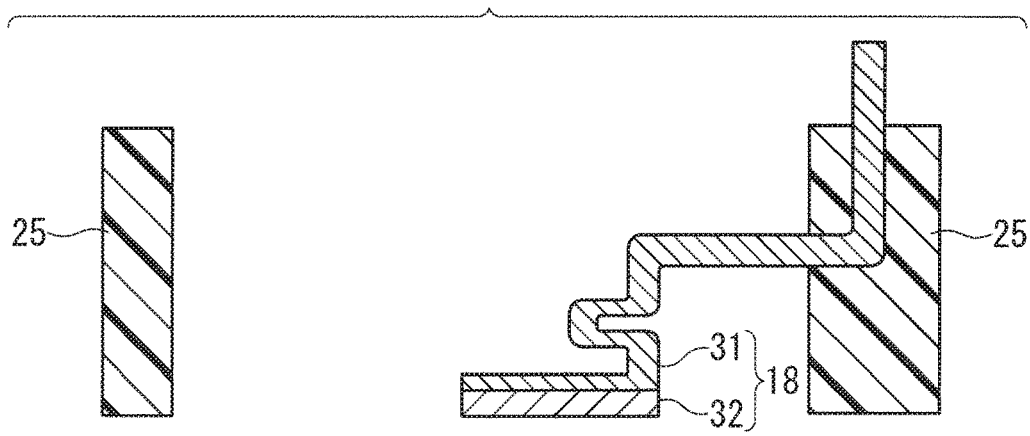
FIG. 9 is a cross-sectional view showing a structure of a part of a power module according to a third preferred embodiment.
Figure 10:
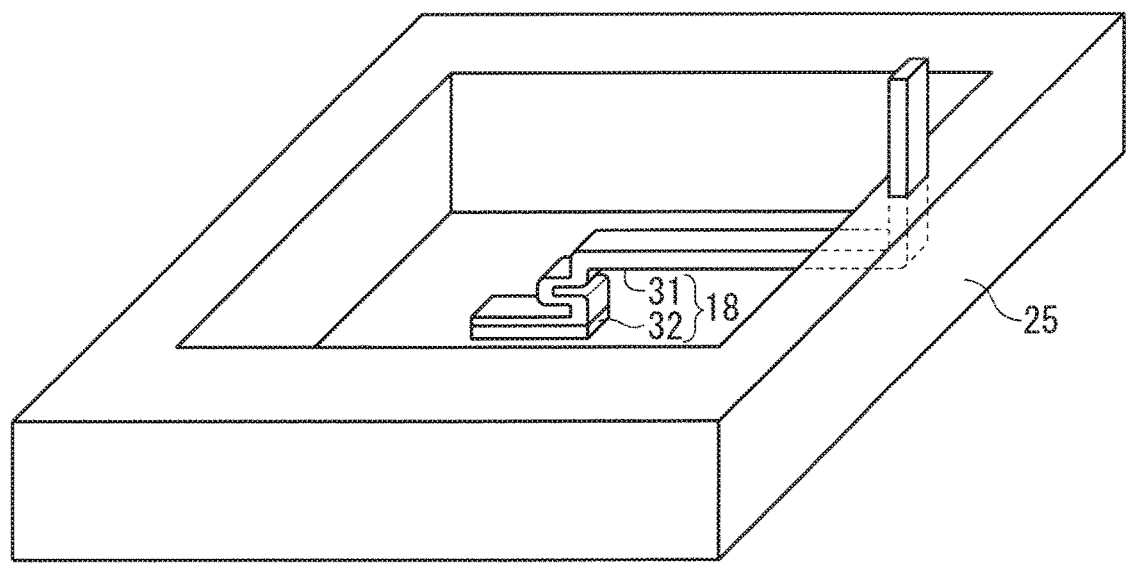
FIG. 10 is a perspective view showing a structure of a part of the power module according to the third preferred embodiment.
Figure 11:
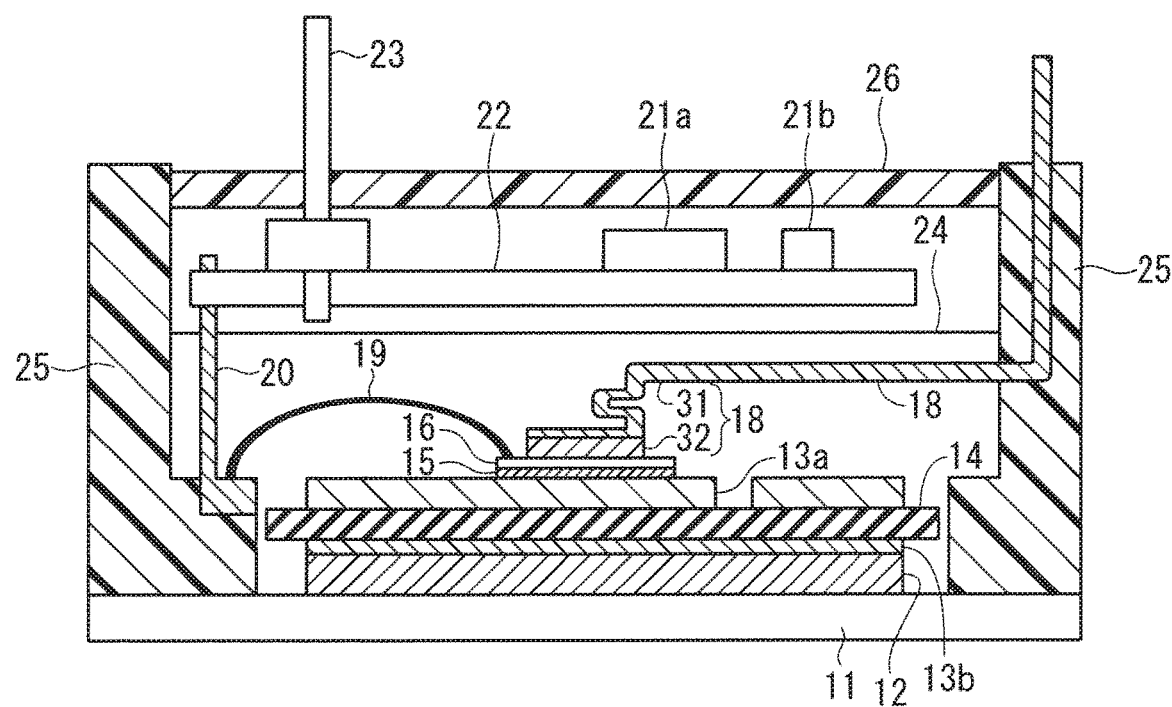
FIG. 11 is a cross-sectional view showing a structure of the power module according to the third preferred embodiment.

FIGS. 9 and 10 are a cross-sectional view and a perspective view, respectively, each of which shows a part of a structure of a power module according to the third preferred embodiment. FIG. 11 is a cross-sectional view showing a structure of the power module according to the third preferred embodiment. It is noted that, out of structural elements described in the third preferred embodiment, structural elements which are the same as, or analogous to, the structural elements described in the first preferred embodiment, will be denoted by the same reference symbols, and structural elements which are different from the structural elements in the first preferred embodiment will be chiefly discussed.

The case 25 according to the third preferred embodiment includes a resin, for example, and surrounds a side part of the power semiconductor chip 16 which is the first bonded member in an analogous manner to the first preferred embodiment. Then, according to the third preferred embodiment, the body 31 of the main electrode terminal 18 is integrated with the case 25. A structure in which the body 31 and the case 25 are integrated with each other can be formed by using an insert molding method in which a case and the main electrode 18 are molded in parallel with each other, or by using an outsert molding method in which the main electrode terminal 18 is additionally inserted after the case 25 is individually molded, or the like.

According to the third preferred embodiment configured in the above-described manner, the body 31 of the main electrode terminal 18 is integrated with the case 25, so that a process of ultrasonically bonding the main electrode terminal 18 to the power semiconductor chip 16 can be carried out in parallel with a process of assembling a package of a power module. Accordingly, in a structure in which the main electrode terminal 18 is ultrasonically bonded to the power semiconductor chip 16, it is possible to improve in assembling a module.

Fourth Preferred Embodiment

Figure 12:
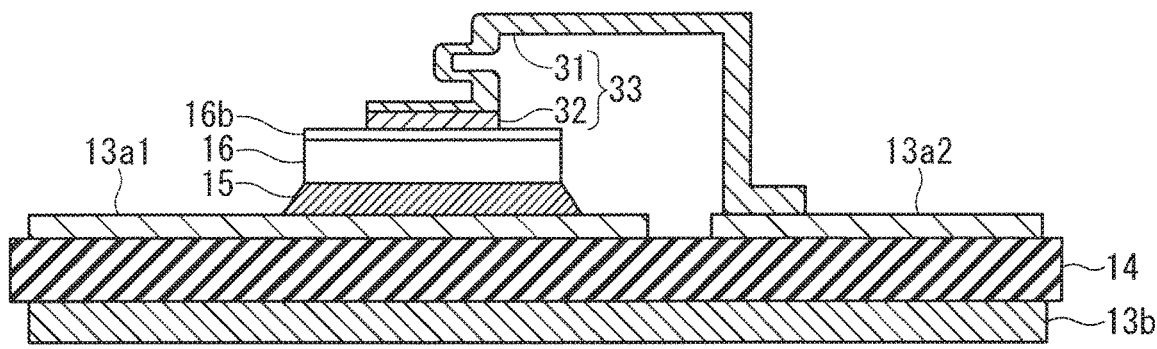
FIGS. 12 to 14 are cross-sectional views each showing a structure of a part of a power module according to a fourth preferred embodiment.

FIG. 12 is a cross-sectional view showing a part of a structure of a power module according to the fourth preferred embodiment. It is noted that, out of structural elements described in the fourth preferred embodiment, structural elements which are the same as, or analogous to, the structural elements described in the first preferred embodiment, will be denoted by the same reference symbols, and structural elements which are different from the structural elements in the first preferred embodiment will be chiefly discussed.

According to the fourth preferred embodiment, an electrode terminal 33 includes the body 31 and the first bonding part 32, like the main electrode terminal 18 described in the first preferred embodiment. Then, the first bonding part 32 bonded to the one end of the body 31 is ultrasonically bondable to the first bonded member, and the other end of the body 31 is ultrasonically bondable to a second bonded member.

In an example shown in FIG. 12, circuit patterns 13a1 and 13a2 separated from each other are disposed on an upper surface of the insulating substrate 14, and the power semiconductor chip 16 is disposed on the circuit pattern 13a1 with the solder 15 being interposed therebetween. Then, the power semiconductor chip 16 is applied as the above-described first bonded member, and the circuit pattern 13a2 is applied as the above-described second bonded member. That is, in the example shown in FIG. 12, the first bonding part 32 provided on a side of the one end of the body 31 and the power semiconductor chip 16 are ultrasonically bonded to each other, and the other end of the body 31 and the circuit pattern 13a2 are ultrasonically bonded to each other.

According to the fourth preferred embodiment configured in the above-described manner, the electrode terminal 33 can be ultrasonically bonded to both of the power semiconductor chip 16 and the circuit pattern 13a2. Accordingly, it is possible to easily implement a power module having high bonding strength. Also, in the structure shown in FIG. 12, in a case where a material of the power semiconductor chip 16 and a material of the circuit pattern 13a2 are different from each other, a metal material which is easy to be ultrasonically bonded to the power semiconductor chip 16 can be applied as the second metal material of the first bonding part 32, and a metal material which is easy to be ultrasonically bonded to the circuit pattern 13a2 can be applied as the first metal material of the body 31. As a result of this, bonding strength can be further increased.

Figure 13:
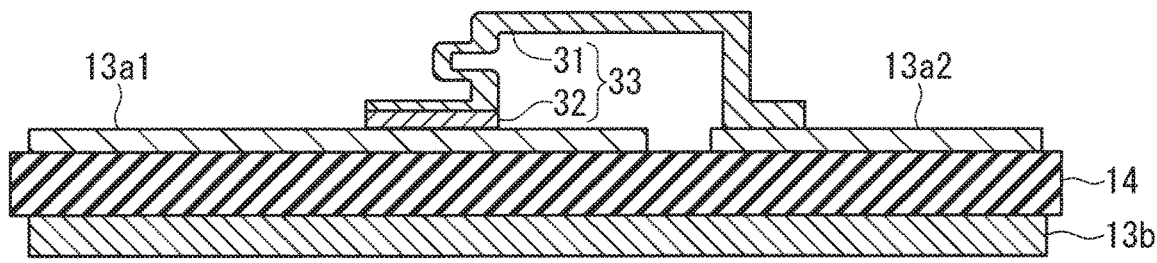
Figure 14:
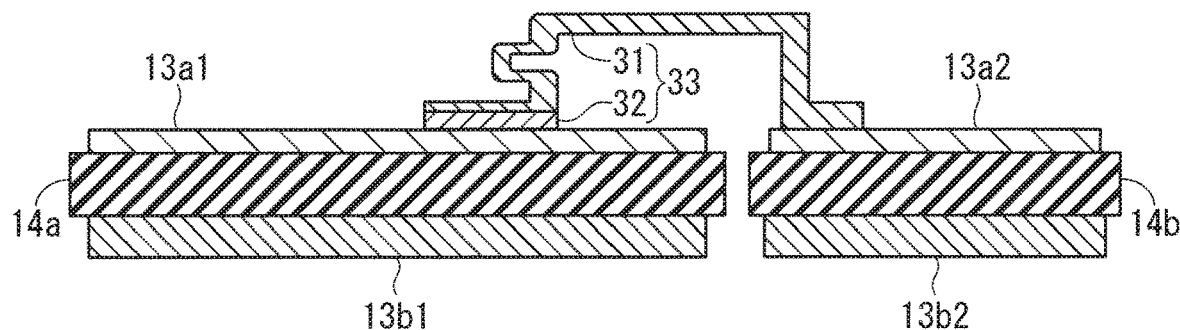

It should be noted that the first bonded member and the second bonded member are not limited to the structural elements shown in FIG. 12, and different structural elements may be applied as the first bonded member and the second bonded member as shown in FIGS. 13 and 14, for example.

FIG. 13 is a cross-sectional view showing another example for the first bonded member and the second bonded member. In the example shown in FIG. 13, the circuit pattern 13a1 is applied as the first bonded member, and the circuit pattern 13a2 is applied as the second bonded member. That is, in the example shown in FIG. 13, the first bonding part 32 provided on a side of the one end of the body 31 and the circuit pattern 13a1 are ultrasonically bonded to each other, and the other end of the body 31 and the circuit pattern 13a2 are ultrasonically bonded to each other.

Also with the above-described structure shown in FIG. 13, it is possible to easily implement a power module having high bonding strength. Further, in the structure shown in FIG. 13, in a case where respective materials of the circuit patterns 13a1 and 13a2 are different from each other, a metal material which is easy to be ultrasonically bonded to the circuit pattern 13a1 can be applied as the second metal material of the first bonding part 32, and a metal material which is easy to be ultrasonically bonded to the circuit pattern 13a2 can be applied as the first metal material of the body 31. As a result of this, bonding strength can be further increased.

FIG. 14 is a cross-sectional view showing another different example for the first bonded member and the second bonded member. In the example shown in FIG. 14, in place of the single insulating substrate 14, a plurality of insulating substrates (insulating substrates 14a and 14b) are disposed. The circuit patterns 13a1 and 13a2 are provided on upper surfaces of the insulating substrates 14a and 14b, respectively, and circuit patterns 13b1 and 13b2 are disposed on lower surfaces of the insulating substrates 14a and 14b, respectively. Then, the circuit pattern 13a1 is applied as the first bonded member, and the circuit pattern 13a2 is applied as the second bonded member. That is, in the example shown in FIG. 14, the first bonding part 32 provided on a side of the one end of the body 31 and the circuit pattern 13a1 are ultrasonically bonded to each other, and the other end of the body 31 and the circuit pattern 13a2 are ultrasonically bonded to each other.

Also with the above-described structure shown in FIG. 14, it is possible to easily implement a power module having high bonding strength. Further, in the structure shown in FIG. 14, in a case where respective materials of the circuit patterns 13a1 and 13a2 are different from each other, a metal material which is easy to be ultrasonically bonded to the circuit pattern 13a1 can be applied as the second metal material of the first bonding part 32, and a metal material which is easy to be ultrasonically bonded to the circuit pattern 13a2 can be applied as the first metal material of the body 31. As a result of this, bonding strength can be further increased.

Fifth Preferred Embodiment

Figure 15:
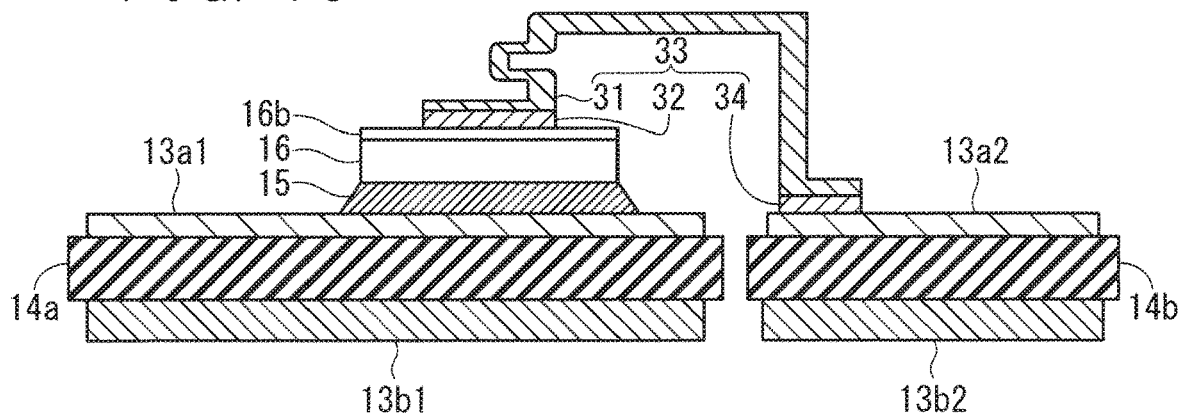
FIG. 15 is a cross-sectional view showing a structure of a part of a power module according to a fifth preferred embodiment.

FIG. 15 is a cross-sectional view showing a part of a structure of a power module according to the fifth preferred embodiment. It is noted that out of structural elements described in the fifth preferred embodiment, structural elements which are the same as, or analogous to, the structural elements described in the first preferred embodiment, will be denoted by the same reference symbols, and structural elements which are different from the structural elements in the first preferred embodiment will be chiefly discussed.

According to the fifth preferred embodiment, the electrode terminal 33 includes not only the body 31 and the first bonding part 32, like the main electrode terminal 18 described in the first preferred embodiment, but also a second bonding part 34. The second bonding part 34 includes a third metal material which is a clad material other than the first metal material, and is bonded to the other end of the body 31. Further, according to the fifth preferred embodiment, the first bonding part 32 bonded to the one end of the body 31 is ultrasonically bondable to the first bonded member, and the second bonding part 34 bonded to the other end of the body 31 is ultrasonically bondable to the second bonded member.

In an example shown in FIG. 15, the circuit patterns 13a1 and 13a2 are disposed on upper surfaces of the insulating substrates 14a and 14b, respectively, the circuit patterns 13b1 and 13b2 are disposed on lower surfaces of the insulating substrates 14a and 14b, respectively, and the power semiconductor chip 16 is disposed on the circuit pattern 13a1 with the solder 15 being interposed therebetween. Then, the power semiconductor chip 16 is applied as the first bonded member, and the circuit pattern 13a2 is applied as the second bonded member. That is, in the example shown in FIG. 15, the first bonding part 32 and the power semiconductor chip 16 are ultrasonically bonded to each other, and the second bonding part 34 and the circuit pattern 13a2 are ultrasonically bonded to each other.

According to the fifth preferred embodiment configured in the above-described manner, a structure of a substrate can be made smaller than that in the fourth preferred embodiment. Also, a metal material which can give a higher priority to reduction in resistance than increase in bonding strength, for example, can be applied as the first metal material of the body 31.

Sixth Preferred Embodiment

Figure 16:
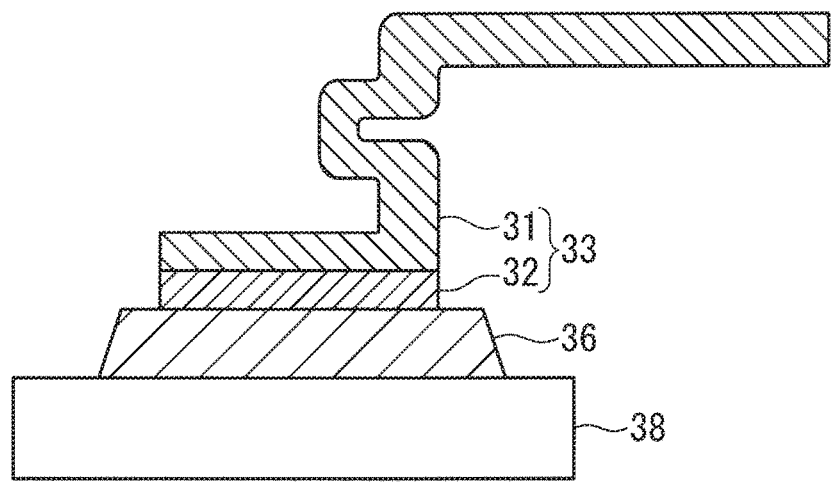
FIGS. 16 and 17 are cross-sectional views each showing a structure of a part of a power module according to a sixth preferred embodiment.
Figure 17:
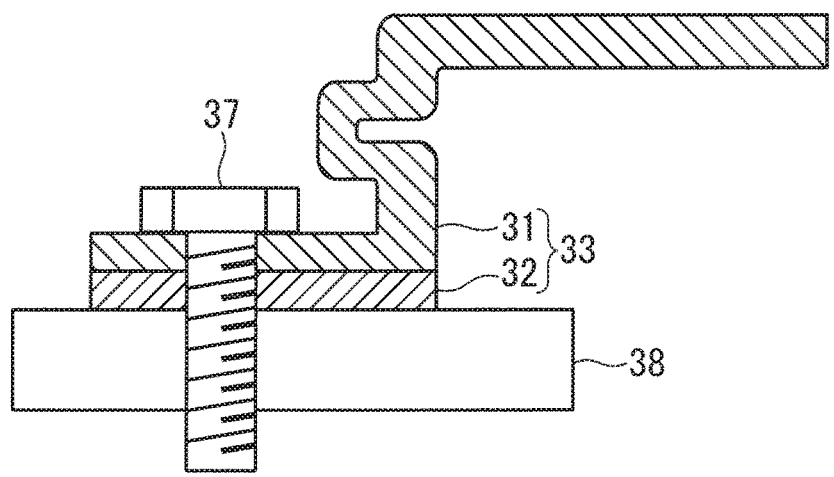

FIGS. 16 and 17 are cross-sectional views each showing a part of a structure of a power module according to the sixth preferred embodiment. It is noted that, out of structural elements described in the sixth preferred embodiment, structural elements which are the same as, or analogous to, the structural elements described in the fourth preferred embodiment, will be denoted by the same reference symbols, and structural elements which are different from the structural elements in the fourth preferred embodiment will be chiefly discussed.

According to the sixth preferred embodiment, the first bonding part 32 or the other end of the body 31 (not a part serving as a clad electrode part) is bondable by solder or a screw, instead of being ultrasonically bondable. While the following description will deal with a structure in which the first bonding part 32 is bondable by solder or a screw, the same description will hold true for a structure in which the other end of the body 31 is bondable by solder or a screw. Also, in the sixth preferred embodiment, it is assumed that a thickness of the first bonding part 32 is thicker than a conventional general plating thickness (two to six μm) (a thickness of the first bonding part 32 is not smaller than 50 μm, for example).

In an example shown in FIG. 16, the first bonding part 32 is bonded to the first bonded member (a metal member 38 to which the first bonding part 32 is bonded) by solder 36. It is noted that though tin which can enhance solder-bondability is applied as the second metal material of the first bonding part 32 in the example shown in FIG. 16, a material of the second metal material is not limited to that.

In this regard, in a general structure, solder-bondability is enhanced by using tin plating for a solder-bonding part. However, in such a structure, when high stress is applied to a bonding part, tin plating peels off, to cause degraded bonding in some instances. Also, as a result of bonding and separation being repeated, a plating layer in a surface may probably disappear, to cause degradation due to abrasion. In contrast thereto, in the example shown in FIG. 16, there is high bondability in solder bonding, and the first bonding part 32 having a relatively large thickness is provided, so that solder-bondability (a life of solder bonding, for example) can be enhanced.

In an example shown in FIG. 17, the first bonding part 32 is bonded to the first bonded member (a metal material 38 to which the first bonding part 32 is bonded) by a screw 37. It is noted that though gold which can enhance screw-bondability is applied as the second metal material of the first bonding part 32 in the example shown in FIG. 17, a material of the second metal material is not limited to that.

In this regard, in a general structure, screw-bondability on contact is improved by using gold plating for a screw bonding part. However, in such a structure, when high stress is applied to a bonding part, gold plating peels off, to cause degraded bonding in some instances. Also, as a result of bonding and separation being repeated, a plating layer in a surface may probably disappear, to cause degradation due to abrasion. In contrast thereto, in the example shown in FIG. 17, there is high bondability in screw bonding and the first bonding part 32 having a relatively large thickness is provided, so that screw-bondability (a life of screw bonding, for example) can be enhanced.

Additionally, though certain kinds of metals are cited as examples of respective materials in the above description, a material other than a metal can be employed so far as the material has great affinity for a metal member being bonded.

Seventh Preferred Embodiment

Figure 18:
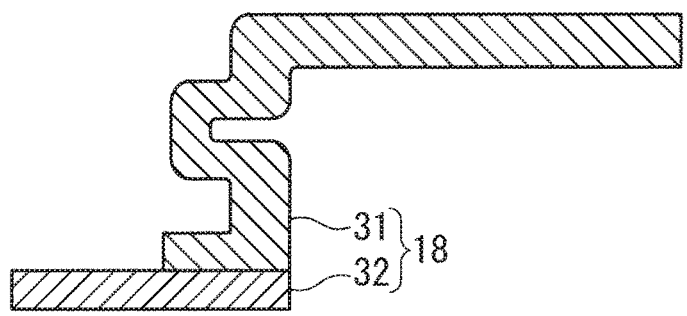
FIG. 18 is a cross-sectional view showing a structure of a part of a power module according to a seventh preferred embodiment.

FIG. 18 is a cross-sectional view showing a part of a structure of a power module according to the seventh preferred embodiment. It is noted that, out of structural elements described in the seventh preferred embodiment, structural elements which are the same as, or analogous to, the structural elements described in the first preferred embodiment, will be denoted by the same reference symbols, and structural elements which are different from the structural elements in the first preferred embodiment will be chiefly discussed.

The first bonding part 32 of the main electrode terminal 18 according to the seventh preferred embodiment protrudes (is exposed) from the one end of the body 31 in plan view.

Figure 19:
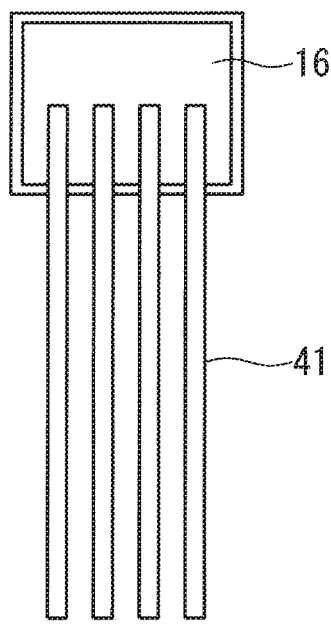
FIGS. 19 to 21 are plan views each for explaining wire bonding.
Figure 20:
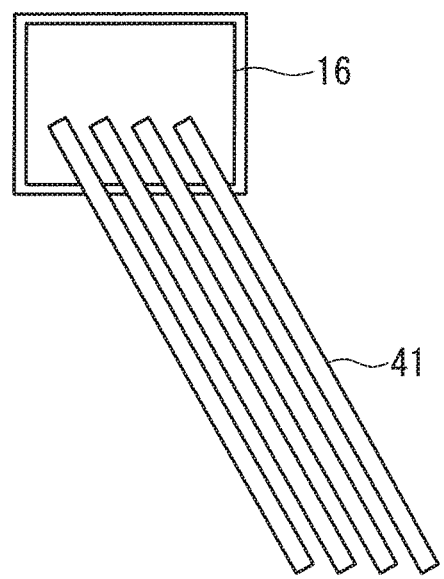

In this regard, as shown in plan views of FIGS. 19 and 20, in wire bonding with the use of an ordinary wire 41, after one end of the wire 41 is bonded to the power semiconductor chip 16, the wire 41 can be drawn out in a desired direction such as a vertical direction and an oblique direction.

Figure 21:
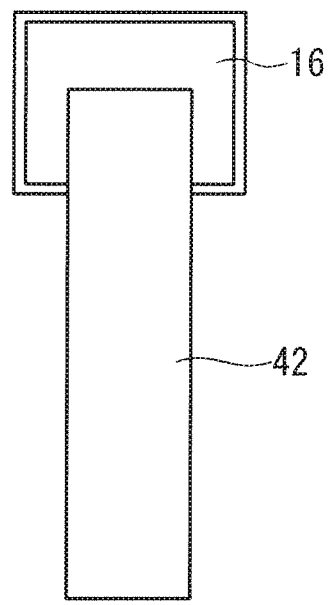

On the other hand, as shown in FIG. 21, in wire bonding with the use of a wide ribbon-shaped wire 42 which can reduce a current density, after one end of the wire 42 is bonded to the power semiconductor chip 16, the wire 42 can be drawn out only in a direction vertical to a width direction. In other words, there is a limitation to a drawing direction (bonding direction).

Figure 22:
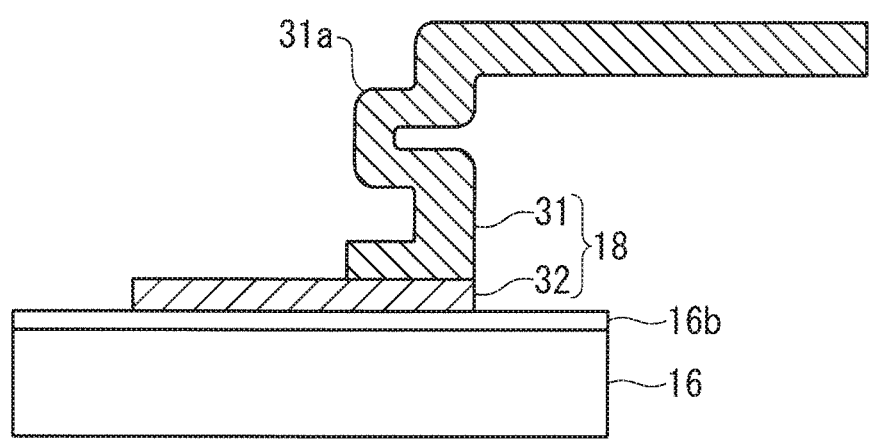
FIG. 22 is a cross-sectional view showing a structure of a part of the power module according to the seventh preferred embodiment.
Figure 23:
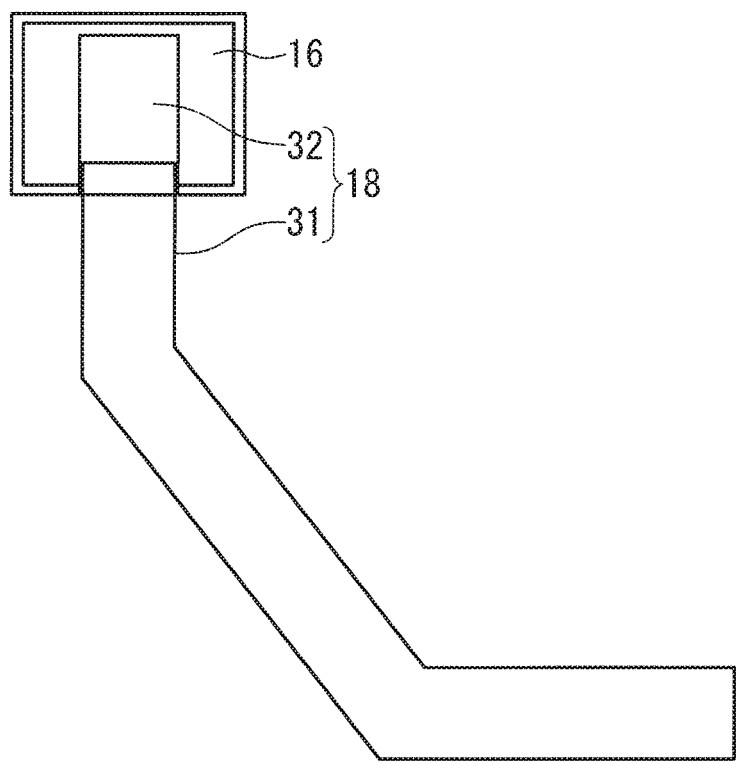
FIG. 23 is a plan view showing a structure of a part of the power module according to the seventh preferred embodiment.

In contrast thereto, according to the seventh preferred embodiment, as shown in a cross-sectional view of FIG. 22 and a plan view of FIG. 23, bonding (ultrasonic bonding) similar to wire bonding can be carried out to the first bonding part 32 which protrudes (is exposed) in plan view. Accordingly, as shown in FIG. 23, by appropriately designing a shape of the body 31 in plan view, it is possible to draw out the main electrode terminal 18 in a desired direction (for example, an oblique direction or a horizontal direction). In other words, flexibility in a drawing direction (bonding direction) can be increased. Also, it is possible to implement the above-described structure by using bonding (ultrasonic bonding) similar to conventional wire bonding.

Eighth Preferred Embodiment

Figure 24:
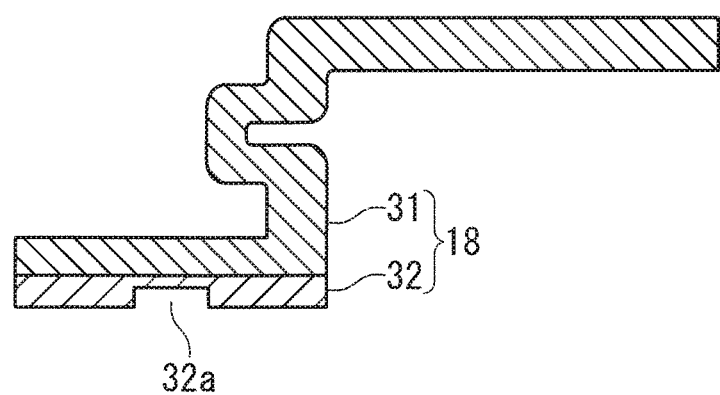
FIGS. 24 and 25 are cross-sectional views each showing a structure of a part of a power module according to an eighth preferred embodiment.

FIG. 24 is a cross-sectional view showing a part of a structure of a power module according to the eighth preferred embodiment. It is noted that, out of structural elements described in the eighth preferred embodiment, structural elements which are the same as, or analogous to, the structural elements described in the first preferred embodiment, will be denoted by the same reference symbols, and structural elements which are different from the structural elements in the first preferred embodiment will be chiefly discussed.

According to the eighth preferred embodiment, as shown in FIG. 24, in the first bonding part 32, a surface which is ultrasonically bonded to the first bonded member is provided with a groove 32a or irregularities not shown in the drawings. That is, according to the eighth preferred embodiment, a surface of the first bonding part 32 which is ultrasonically bonded is not uniform in height, and some part thereof has a different height. Additionally, the groove 32a or irregularities not shown in the drawings can be formed by using a chemical treatment such as etching, or can be formed by using a mechanical treatment such as punching and laser processing.

Figure 25:
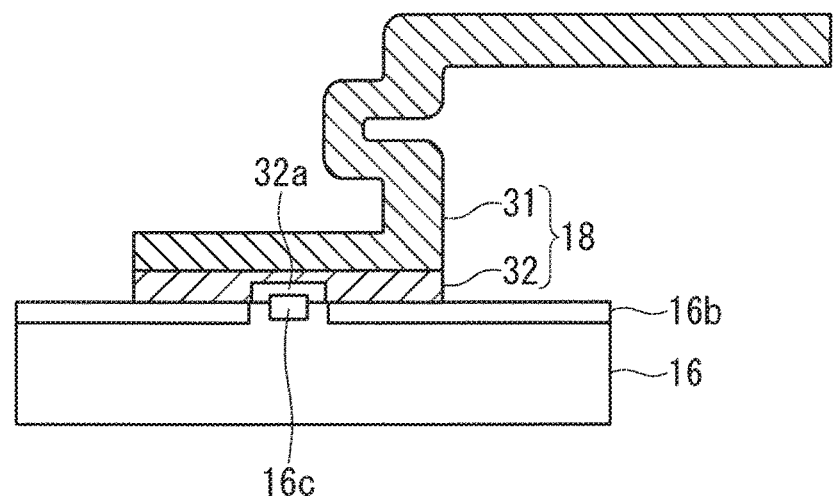

In the meantime, as shown in FIG. 25, in a case where a protruding part 16c which cannot be ultrasonically bonded for physical reasons, such as wiring of a gate signal and a sensor part, is present on the power semiconductor chip 16, there is a need to exclude the protruding part from objects being ultrasonically bonded. However, in a case where a surface which is ultrasonically bonded to the first bonded member is flat, it becomes necessary to increase the number of electrodes or bifurcate an electrode in order to avoid the protruding part 16c, which complicates manufacturing processes.

In contrast thereto, according to the eighth preferred embodiment, in the first bonding part 32, a surface which is ultrasonically bonded to the first bonded member is provided with the groove 32a or irregularities not shown in the drawings, so that the protruding part 16c can be excluded from objects being ultrasonically bonded without making manufacturing process more complicate than necessary.

Modifications

Figure 26:
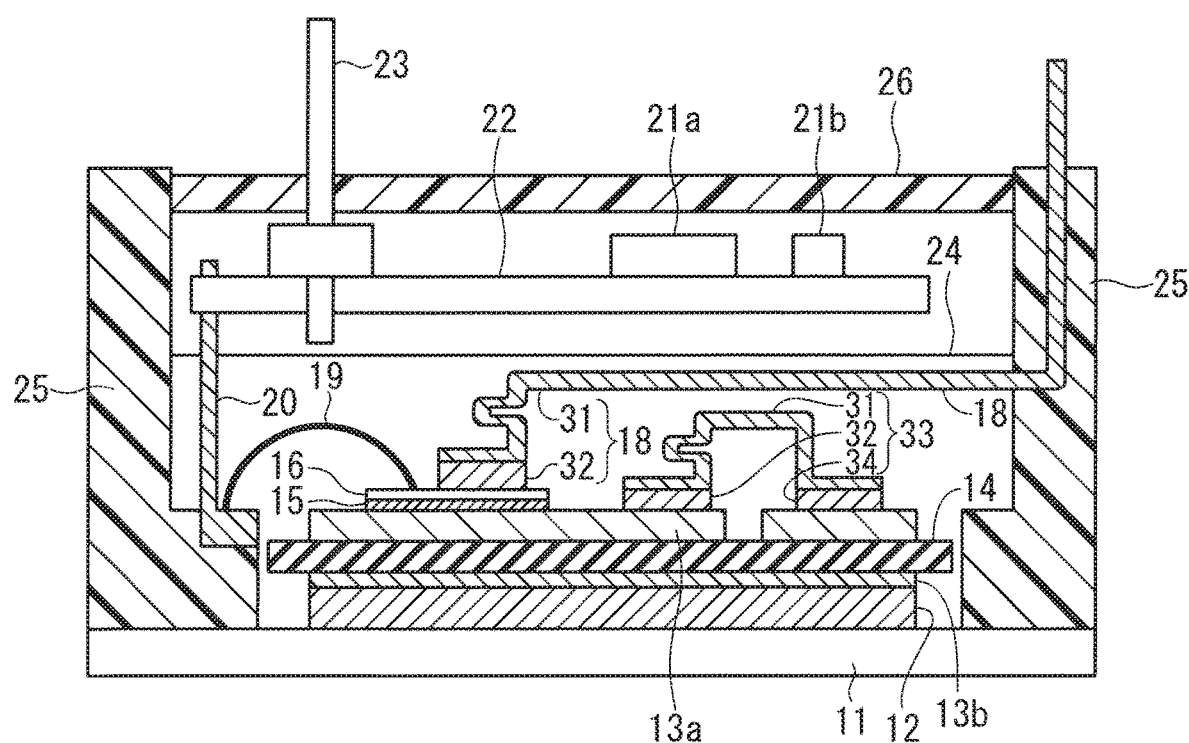
FIG. 26 is a cross-sectional view showing a structure of a power module according to a modification.

The above-described structures according to the first to eighth preferred embodiments can be appropriately combined with one another. FIG. 26 is a cross-sectional view showing an example of a structure of a power module obtained by appropriately combining the first to eighth preferred embodiments.

The power module shown in FIG. 26 includes the main electrode terminal 18 (FIG. 6) described in the first preferred embodiment and the electrode terminal 33 (FIG. 15) described in the fifth preferred embodiment. Accordingly, the same effects as attained in the first preferred embodiment and the fifth preferred embodiment can be attained.

Also, in the power module shown in FIG. 26, the body 31 of the main electrode terminal 18 is integrated with the case 25 in an analogous manner to that in the third preferred embodiment. Accordingly, the same effects as attained in the third preferred embodiment can be attained.

Also, in the power module shown in FIG. 26, a control circuit unit (the control IC 21a and the control circuit part 21b) is an intelligent power module (IPM) electrically connected to the power semiconductor chip 16. In such a structure, a core block part and a control block part can be separated from each other.

Generally, while an IPM, which is provided with a control circuit, allows for miniaturization of a product structure on a user's side, there is a demand for further miniaturization and higher integration of an IPM itself. However, further miniaturization and higher integration causes heat concentration, to make reliability of a power module questionable in some instances.

In contrast thereto, the power module shown in FIG. 26 includes at least one of the above-described main electrode terminal 18 and the above-described electrode terminal 33, so that reliability can be improved. This matter is effective especially in a field of an IPM which is required to be further miniaturized and higher integrated.

Moreover, a power conversion apparatus which is provided with one or more power modules described in the first to eighth preferred embodiments (for example, an inverter apparatus, a converter apparatus, a servo amplifier, a power supply unit, and the like) can be configured. As a result of this, it is possible to implement a power conversion apparatus having higher reliability and a longer life than an apparatus implemented by using bonding such as wire bonding. Also, such a power conversion apparatus can be expected to have higher output power than a conventional apparatus, by utilizing a longer life thereof. Therefore, miniaturization of a circuit configuration and a package of a power conversion apparatus, or improvement in output performance of a power conversion apparatus, can be expected. It is additionally noted that power for an input of an input power supply and power for an output of a power conversion apparatus may be of any kind, that is, the power may be either single-phase power or three-phase power, and may be either direct-current power or alternating-current power.

Moreover, while the power semiconductor chip 16 may include silicon (Si), the power semiconductor chip 16 may alternatively include a wide band-gap semiconductor such as silicon carbide (SiC) and gallium nitride (GaN), for example. In general, to use a wide band-gap semiconductor could attain an advantage of lower loss of a module itself resulted from a higher-speed switching operation, an advantage of high-temperature resistance, and the like. Thus, a device including a wide band-gap semiconductor is used under conditions of a high frequency, a high-speed switching operation, and a high temperature in more instances than a silicon device. In a power module used for the above-described purposes, internal wiring included therein is required to be reduced in impedance and be improved in a bonding life in an operation at a high frequency and a high temperature. Therefore, the power modules described in the first to eighth preferred embodiment and the power conversion apparatus including the power modules described in the first to eighth preferred embodiments exert effects thereof especially when including a wide band-gap semiconductor.

Furthermore, a wide band-gap semiconductor such as SiC and GaN has higher hardness than Si (for example, Vickers hardness of Si is approximately 10 GPa, and on the other hand, Vickers hardness of SiC is not smaller than 20 GPa).

Therefore, by configuring the power semiconductor chip 16 with the use of SiC having high hardness, for example, it is possible to increase applied power in ultrasonically bonding directly to the power semiconductor chip 16. As a result of this, an effect of further increasing bonding strength can be attained.

While the invention has been shown and described in detail, the foregoing description is in all aspects illustrative and not restrictive. It is therefore understood that numerous modifications and variations can be devised without departing from the scope of the invention.

What is claimed is:

1. An electrode terminal, comprising:
a body composed of a single length of wire and made of only a first metal material, wherein an elastic part is provided between one end of said body and an other end of said body; and
a first bonding part located on a flat surface of said one end of said body, said first bonding part composed of a second metal material other than said first metal material, the second metal material being clad directly to the first metal material with nothing in-between in cross-section, and being clad to the first metal material proximate to the first bonding part in cross-section,
said first bonding part being ultrasonically bonded directly to a first bonded member with nothing in-between in cross-section, the first bonded member being a bondable metal disposed directly on a semiconductor chip, wherein
said elastic part includes at least one of a notch and a plurality of discrete bends in the body, such that said elastic part produces a spring effect and thus is elastically deformable,
a surface, which is ultrasonically bonded to said first bonded member in said first bonding part, is provided with a groove or irregularities, and
said groove or said irregularities of said electrode terminal accommodate a protruding part provided in said first bonded member.

2. The electrode terminal according to claim 1, wherein a plurality of irregularities or holes are provided in substantially all parts of a surface of said body in such a way as to appreciably reduce impedance in a band of frequencies.

3. The electrode terminal according to claim 1, wherein said other end of said body is ultrasonically bonded to a second bonded member.

4. An electrode terminal, comprising:
a body composed of a single length of wire and made of only a first metal material, wherein an elastic part is provided between one end of said body and an other end of said body; and
a first bonding part located on a flat surface of said one end of said body, said first bonding part composed of a second metal material other than said first metal material, the second metal material being clad directly to the first metal material with nothing in-between in cross-section, and being clad to the first metal material proximate to the first bonding part in cross-section,
said first bonding part being bonded to a first bonded member, the first bonded member being a bondable metal disposed directly on a semiconductor chip, wherein
said other end of said body is bonded to a second bonded member,
said first bonding part or said other end of said body is bonded by solder or a screw,
said elastic part includes at least one of a notch and a plurality of discrete bends in the body, such that said elastic part produces a spring effect and thus is elastically deformable,
a surface, which is ultrasonically bonded to said first bonded member in said first bonding part, is provided with a groove or irregularities, and
said groove or said irregularities of said electrode terminal accommodate a protruding part provided in said first bonded member.

5. The electrode terminal according to claim 1, further comprising
a second bonding part bonded to said other end of said body that includes a third metal material, which is a material other than said first metal material and clad to said first metal material, wherein
said second bonding part is ultrasonically bonded to a second bonded member.

6. The electrode terminal according to claim 1, wherein said first bonding part protrudes from said one end of said body in plan view.

7. A semiconductor device, comprising:
the electrode terminal according to claim 1.

8. The semiconductor device according to claim 7, further comprising
a case which surrounds a side part of said first bonded member, wherein
said body of said electrode terminal is integrated with said case.

9. The semiconductor device according to claim 7, wherein
said semiconductor device further comprises a control circuit part which is electrically connected to said semiconductor chip.

10. The semiconductor device according to claim 9, wherein
said semiconductor chip includes a wide band-gap semiconductor.

11. A power conversion apparatus, comprising
the semiconductor device according to claim 7.

12. The electrode terminal according to claim 1, wherein the second metal material is clad to the first metal material proximate to only the first bonding part in cross-section.

13. The electrode terminal according to claim 4, wherein the second metal material is clad to the first metal material proximate to only the first bonding part in cross-section.

14. An electrode terminal, comprising:
a body composed of a single length of wire and made of only a first metal material, wherein an elastic part, having a substantially U-shaped structure and being elastically deformable, is provided between one end of said body and an other end of said body; and
a first bonding part located on a flat surface of said one end of said body, said first bonding part composed of a second metal material other than said first metal material, the second metal material being clad directly to the first metal material with nothing in-between in cross-section, and being clad to the first metal material proximate to the first bonding part in cross-section,
said first bonding part being ultrasonically bonded directly to a main surface of a first bonded member with nothing in-between in cross-section, the first bonded member being a bondable metal disposed directly on a semiconductor chip, wherein a surface, which is ultrasonically bonded to said first bonded member in said first bonding part, is provided with a groove or irregularities, an opening of the substantially U-shaped structure is provided in a direction that is substantially parallel to the main surface of the first bonding part, and said groove or said irregularities of said electrode terminal accommodate a protruding part provided in said first bonded member.

* * * * *